US007773441B2

(12) United States Patent
Bunker et al.

(10) Patent No.: US 7,773,441 B2
(45) Date of Patent: Aug. 10, 2010

(54) MEMORY MALFUNCTION PREDICTION SYSTEM AND METHOD

(75) Inventors: Layne Bunker, Boise, ID (US); Ebrahim Hargan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 12/141,716

(22) Filed: Jun. 18, 2008

(65) Prior Publication Data

US 2009/0316501 A1 Dec. 24, 2009

(51) Int. Cl.
G11C 29/00 (2006.01)
G11C 7/00 (2006.01)
(52) U.S. Cl. .................. 365/201; 365/222; 714/718
(58) Field of Classification Search .................. 365/201
See application file for complete search history.

(56) References Cited

U.S. PATENT DOCUMENTS

| 6,697,992 | B2 * | 2/2004 | Ito et al. ..................... 714/763 |
| 6,862,240 | B2 * | 3/2005 | Burgan ........................ 365/222 |
| 7,158,433 | B2 * | 1/2007 | Riho et al. ................... 365/222 |
| 7,167,403 | B2 * | 1/2007 | Riho et al. ................... 365/200 |
| 7,450,458 | B2 * | 11/2008 | Mori et al. ................... 365/222 |
| 2003/0204689 | A1 * | 10/2003 | Shimoda ..................... 711/161 |
| 2004/0062119 | A1 * | 4/2004 | Stimak et al. ............... 365/222 |
| 2005/0249010 | A1 | 11/2005 | Klein ......................... 365/222 |
| 2007/0030746 | A1 | 2/2007 | Best et al. ................... 365/222 |
| 2007/0174718 | A1 | 7/2007 | Fouquet-Lapar ............. 714/42 |
| 2008/0046798 | A1 | 2/2008 | Brown ........................ 714/764 |

* cited by examiner

*Primary Examiner*—Son L Mai
(74) *Attorney, Agent, or Firm*—Dorsey & Whitney LLP

(57) ABSTRACT

A memory malfunction prediction system and method, such as those that sequentially stress each row of memory cells in an array by decreasing the refresh rate of the row. Prior to doing so, the data stored in the row can be copied to a holding row, and a CRC value for the data can be generated and stored. After the test, the data stored in the row being tested can be read, and a CRC value for the data can then be generated. This after test CRC value can be compared to the stored pre-test CRC value. In the event of a match, the row can be considered to be functioning properly, and the next row can then be tested. If the CRC values do not match, a predicted malfunction of the row can be considered to exist, and corrective action can be taken, such as by repairing the row by substituting a redundant row of memory cells.

19 Claims, 3 Drawing Sheets

MEMORY MALFUNCTION PREDICTION SYSTEM AND METHOD

TECHNICAL FIELD

This invention relates to memory devices, and, more particularly, in various embodiments, to a system and method for predicting memory malfunctions before they occur to allow corrective action to be taken before the memory device malfunction occurs.

BACKGROUND OF THE INVENTION

A wide variety of memory devices are found in electronic systems. For example, dynamic random access memory devices ("DRAM") are commonly used as system memory in computer systems. Although DRAM devices are highly reliable, they nevertheless do, at times, malfunction. Common DRAM device malfunction mode are data retention errors, which result when memory devices are unable to store data for a period of adequate duration. As is well-know in the art, DRAM cells must be periodically refreshed to retain. Data retention errors often result from the inability of DRAMs memory cells to retain data between refreshes.

DRAM devices used in a computer system are normally tested during "boot-up" of the computer system. However, even if the DRAM devices pass the test during boot-up, they may malfunction during subsequent use. A DRAM device malfunction usually does not create too much of a problem because the system can simply be powered down and repaired by obtaining and installing a new DRAM device. Although the system must be shut down while the DRAM device is being installed, that also is usually not much of a problem. However, there are systems that cannot be shut down without creating somewhat greater problems. For example, shutting down a computer used to service a network of automatic teller ("ATM") machines would render the ATM machines unusable for the entire period that the repair was being made. Another example results from malfunctions of a DRAM device used as system memory in a computer system performing a computation that may take a very long time, such as several weeks, to complete. If the DRAM device malfunctions well into the computation, it is often necessary to repeat the entire calculation after the malfunctioning DRAM device has been replaced. Unfortunately, there have been no suitable techniques to mitigate the adverse effects of such DRAM malfunctions.

There is therefore a need for a system and method that, for example, reduces the risk of unexpected memory device malfunctions from occurring during use of electronic systems, such as computer systems, containing DRAM devices.

DETAILED DESCRIPTION

Figure 1:
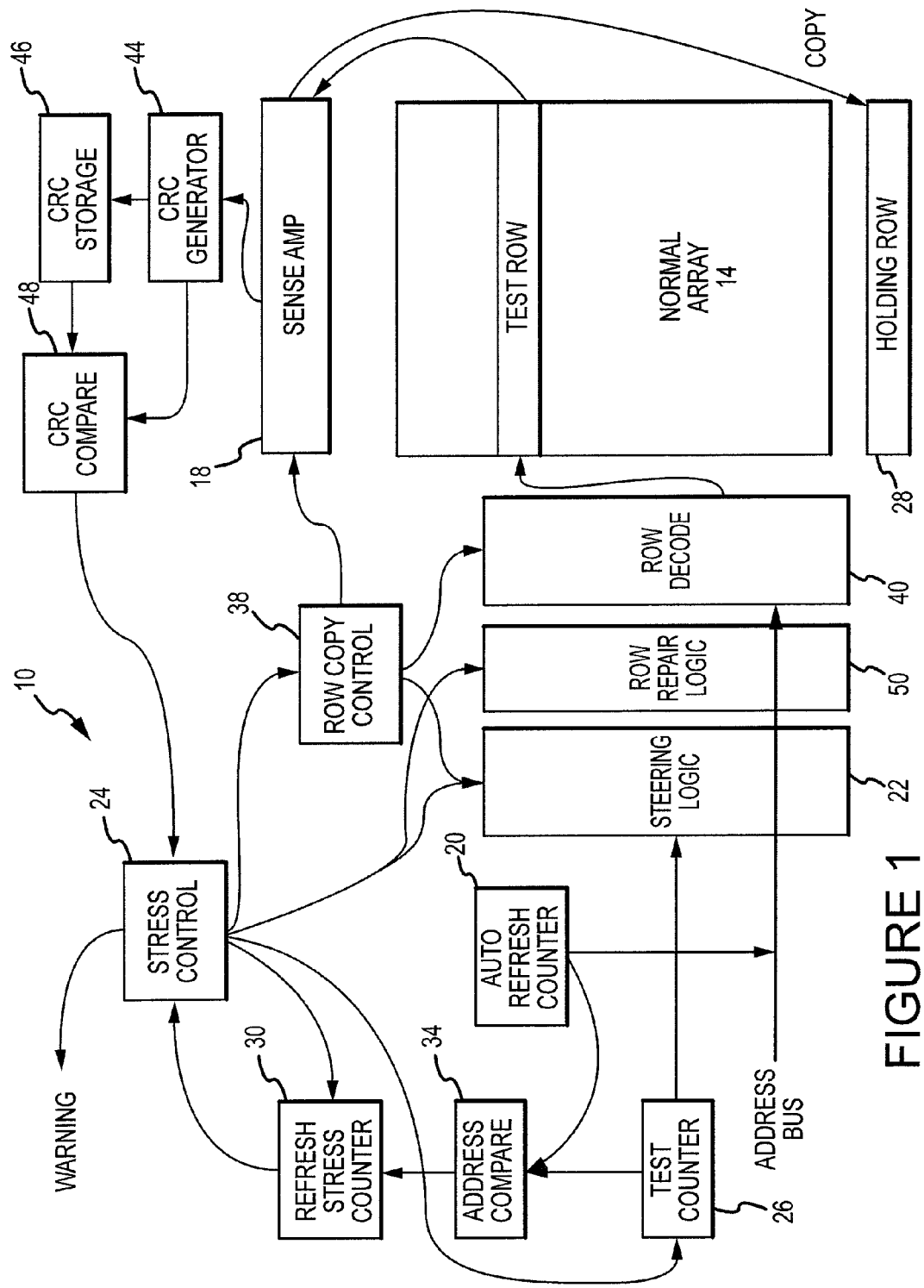
FIG. 1 is a block diagram of a memory device containing a memory malfunction prediction system according to one embodiment of the invention.

A DRAM device 10 according to one embodiment of the invention is shown in FIG. 1. As explained in greater detail below, the DRAM device 10 includes circuitry for predicting DRAM malfunctions before the malfunctions actually occur. As a result, there is sufficient time for suitable correction action to be taken. The DRAM device 10 predicts DRAM malfunctions by sequentially testing each row of DRAM cells. During the test of each row, the data stored in the row is saved in an alternate storage location, and the DRAM cells in the row being tested are refreshed at a test rate, which is slower than the rate used during normal refresh. After the extended refresh interval, the DRAM cells in the row are read, and the data read from the cells are compared to the data stored at the alternate storage location. If the data do not match, a future malfunction alert is provided.

With further reference to FIG. 1, the DRAM device 10 includes an array 14 of DRAM memory cells arranged in rows and columns in a conventional manner. The DRAM cells in the array 14 are coupled to a set of sense amplifiers 18, one of which is usually provided for each column of memory cells. DRAM cells in the array 14 are normally accessed for a read or write operation responsive to memory commands received by the DRAM device 10 and decoded by a command decoder (not shown). Data are then read from or written to DRAM cells identified by a row and column address. The row and column addresses are normally applied to the DRAM device 10 through an address bus (not shown) and decoded by row and column decoders (not shown). The row decoder decodes a row address to select a row of DRAM cells in the array 14, and the column decoder decodes a column address to select a column of DRAM cells in the array 14.

The DRAM device 10 includes a stress controller 24 that controls the operation of the DRAM device to predict future malfunctions, as explained in greater detail below. The DRAM device also includes a test counter 26 that is incremented to provide row addresses in sequence as each row is tested. The address of the row currently being tested is applied to the steering logic 22, which remaps that address to a holding row 28 when the steering logic 22 receives the address of the row currently being tested from the auto refresh counter 20. As a result, when the auto refresh counter 20 outputs the address of the row being tested, the address is remapped to the holding row 28 so that the row being tested is not refreshed. Instead, the holding row 28 is refreshed. As explained in greater detail below, the holding row 28 is where the data that was stored in the row being tested is stored during the test so that no data is lost during testing. Although a dedicated holding row 28 is used in the embodiment of FIG. 1, in other embodiments the row used to store the data from the row being tested is dynamically selected.

The DRAM device 10 also includes a refresh stress counter 30, which is incremented by an address comparator 34. The address comparator 34 receives the address of the row being refreshed from the auto refresh counter 20 and the address of the row being tested from the test counter 26. In the event of an address match, the address comparator 34 outputs a signal that causes the refresh stress counter 30 to increment. The refresh stress counter 30 thus keeps track of how many times a refresh of the row being tested has been skipped. When the count of the refresh stress counter 30 reaches a particular (e.g., predetermined) number, it outputs a "row complete" signal to the stress controller 24 to indicate that testing of the row has been completed. The stress controller 24 then issues a signal to the test counter 26 that causes it to increment to the address of the next row to be tested.

As mentioned above, prior to testing each row of DRAM cells, the data stored in that row is transferred to the holding row 28. This is accomplished by the stress controller 24 outputting a signal to a row copy controller 38. The row copy controller 38 outputs a signal to the steering logic 22 and a row decoder 40 which causes the row to be tested to be actuated so that the data in that row are output from the sense amplifiers 18. The steering logic 22 then actuates the holding row 28 so that the data output from the sense amplifiers 18 are stored in the holding row 28.

When the sense amplifiers 18 output the data stored in the row to be tested, the data is received by a cyclic redundancy check "CRC" generator 44 which generates a CRC value corresponding to the data. The CRC value is then stored in a CRC storage device 46, such as a conventional register, during the testing of the row that stored that data. When the test of each row is completed, the refresh stress counter 30 outputs a signal to the stress controller 24. The stress controller 24 then outputs a signal to the steering logic 22, which again actuates the row being tested. The data stored in that row during the test is then output by the sense amplifiers 18, and the CRC generator 44 generates a CRC value corresponding to that data. The generated CRC value is applied to a CRC comparator 48, which also receives the CRC value stored in the CRC storage device 46. In the event of a match, which indicates that the row being tested was able to retain the stored data during the test despite being skipped for refreshes, the CRC comparator 48 outputs a pass signal to the stress controller 24. The stress controller 24 responds by applying a signal to the test counter 26, which causes it to increment to the address of the next row to be tested.

If the data stored in the row being tested at the end of the test does not match the data that was stored in the row prior to the test, the CRC values corresponding to the different data will not match. As a result, the CRC comparator 48 will output a "fail" signal to the stress controller 24. The stress controller 24 then issues a signal to row repair logic 50 that causes a redundant row of memory cells in the array 14 to be substituted for the malfunctioning row. This may be accomplished by programming the row repair logic 50 to remap the address of the malfunctioning row to the address of the redundant row that is being substituted for the malfunctioning row. However, in other embodiments, the stress controller 24 causes other types of corrective action to be taken. For example, the stress controller 24 may output a signal to circuitry (not shown) such as a clock generator that generates a signal that increments the auto refresh counter 20 to cause it to more quickly increment. Doing so decreases the refresh interval so that the memory cells in the malfunctioning row are refreshed more frequently. Other types of corrective action may also be taken.

Figure 2:
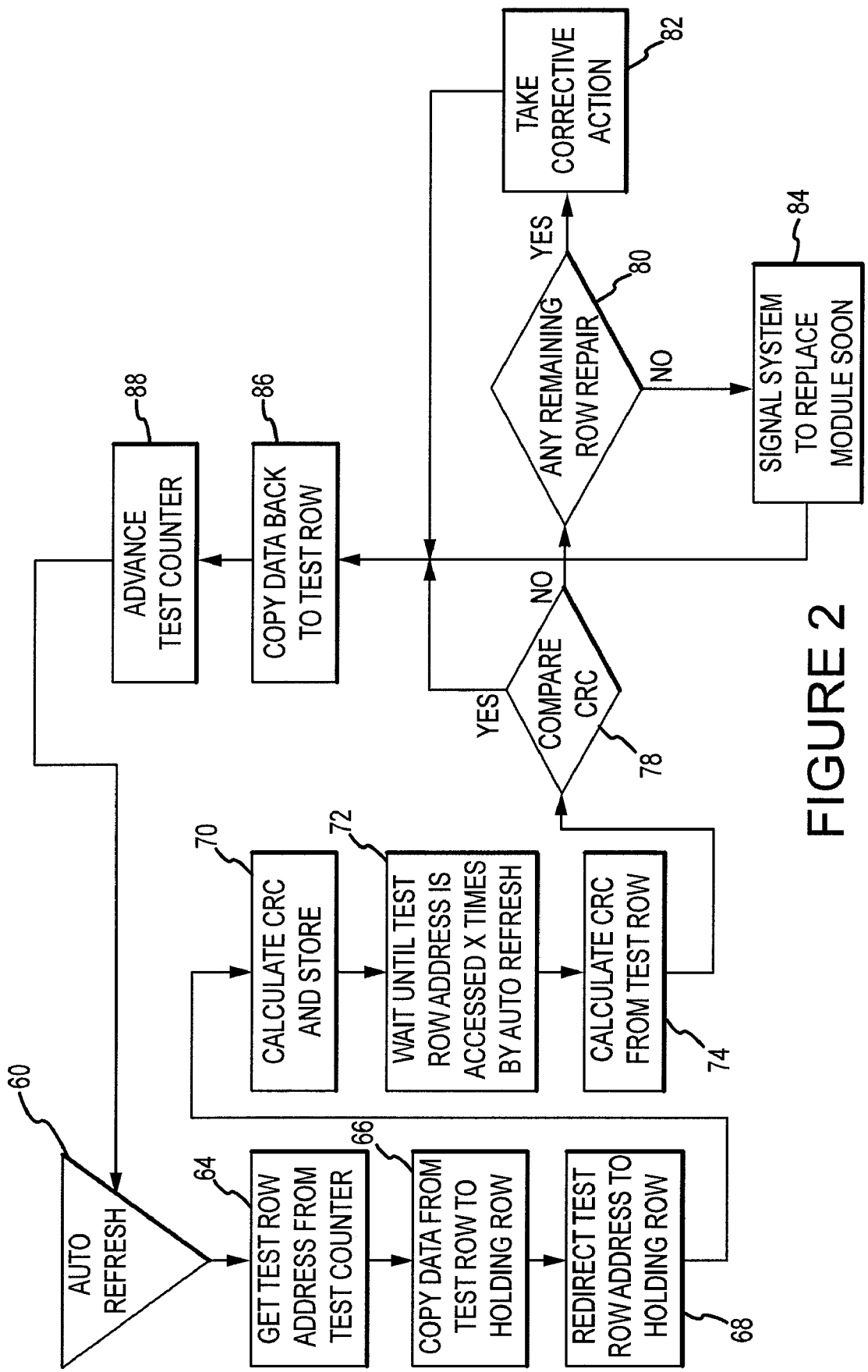
FIG. 2 is a flow chart of a method for predicting memory device malfunctions according to one embodiment of the invention.

A method of testing the memory cells in the array 14 according to another embodiment of the invention is shown in FIG. 2. In this method, the test is initiated responsive to detecting an auto-refresh command at step 60. The address of the row to be tested is then obtained from the test counter 26 at step 64, and the data stored in the row being tested is transferred to the holding row 28 at step 66. At step 68, the steering logic 22 causes the address of the row being tested to be mapped (e.g., redirected) to the address of the holding row 28 so that the steering logic can cause the holding row to be refreshed each time the auto refresh counter 20 outputs the address of the row being tested. As a result, the holding row 28 is refreshed at the normal refresh rate. Also, prior to skipping refreshes of the row being tested, the CRC generator 44 generates a CRC value and causes the CRC value to be stored in the CRC storage device 46 at step 70. This CRC value corresponds to the data from the row being tested, which was stored in the holding row 28 at step 66. At step 72, the refresh address counter 26 is incremented through several refresh cycles as explained above with the refresh stress counter 30 being incremented each time a refresh of the row being tested is skipped. When the refresh test counter 30 reaches a particular count, the data stored in the row being tested is read and a CRC value is calculated at step 74. The CRC comparator 48 compares the CRC value generated before the test to the CRC value generated after the test at step 78. If the CRC values do not match, a determination is made at step 80 whether there are any remaining rows that can be repaired or other corrective action taken. If so, corrective action is taken at step 82. This corrective action may be, for example, causing the row repair logic 50 to repair the row by mapping accesses to a redundant row or by increasing the refresh rate. If there are no more rows that can be repaired or other corrective action taken, a signal is generated at step 84 to provide a warning that the memory device (e.g., a memory module) should be replaced soon. The data that was stored in the holding row 28 at step 66 is then copied to the row of memory cells that was just tested at step 86 so that the row will now be storing the correct data. The test counter 26 is then advanced to the address of the next row to be tested at step 88.

Returning to step 78, if a determination is made that the CRC value generated from the data stored in the row being tested before the test matches the CRC value generated from the data stored in that row after the test, the data stored in the holding row is copied back to the row being tested at step 86, and the test counter is advanced at step 88, as explained above. However, in some embodiments, the method progresses directly to step 88 from step 78 if the CRC generated from the data stored in the row under test after the test matches the CRC generated from the data stored in the row before the test since the row under test will be storing the correct data, thus making step 86 unnecessary.

Figure 3:
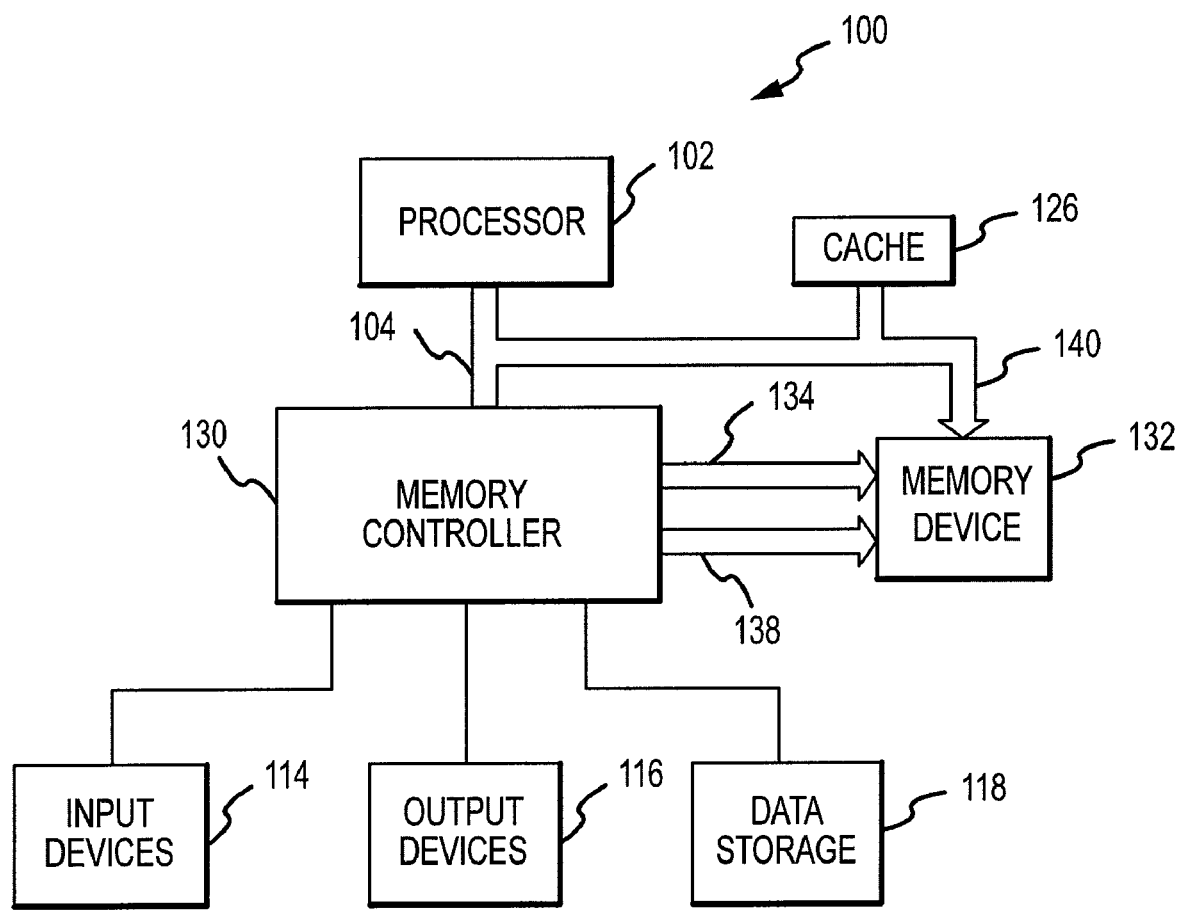
FIG. 3 is a block diagram of a computer system containing a memory device according to an embodiment of the invention.

The memory device 10 or a memory device according to some other embodiment of the invention may be used in a wide variety of electronic systems. For example, the memory device 10 is used in a computer system 100 as shown in FIG. 3. The computer system 100 includes a processor 102 for performing various computing functions, such as executing specific software to perform specific calculations or tasks. The processor 102 includes a processor bus 104 that normally includes an address bus, a control bus, and a data bus. In addition, the computer system 100 includes one or more input devices 114, such as a keyboard or a mouse, coupled to the processor 102 to allow an operator to interface with the computer system 100. Typically, the computer system 100 also includes one or more output devices 116 coupled to the processor 102, such output devices typically being a printer or a video terminal. One or more data storage devices 118 are also typically coupled to the processor 102 to allow the processor 102 to store data in or retrieve data from internal or external storage media (not shown). Examples of typical storage devices 118 include hard and floppy disks, tape cassettes, and compact disk read-only memories (CD-ROMs). The processor 102 is also typically coupled to cache memory 126, which is usually static random access memory ("SRAM"). Finally, the processor is coupled to the memory device 10 through a memory controller 130. The memory controller 130 is coupled to a memory device 132 according to one embodiment of the invention, such as the memory device 10 of FIG. 1. The memory device 132 is coupled to the memory controller 130 through a control bus 134 and an address bus 138. A data bus 140 is coupled from the memory device 132 to the processor bus 104 either directly (as shown), through the memory controller 130, or by some other means.

From the foregoing it will be appreciated that, although specific embodiments of the invention have been described herein for purposes of illustration, various modifications may be made without deviating from the spirit and scope of the invention. For example, although the memory malfunction prediction system and method has been described in the context of a system for predicting malfunctions of DRAM devices resulting from data retention problems, it may also be applied to predict a variety of other problems in DRAM devices or other types of memory devices. For example, it may be used to predict malfunctions in flash memory devices. Instead of testing and repairing the flash memory cells on a row-by-row basis, the flash memory cells could be tested and repaired on a block-by-block or other basis. In such case, the data stored in the block to be tested would be transferred to a holding block during the test. The data stored there, or a compressed version of the data such as a CRC value, would then be compared to the same generated from the data stored in the block after the test had been completed. Since flash memory cells need not be refreshed, the flash memory cells could be tested (e.g., stressed) in ways other than by reducing a refresh rate. For example, the memory cells in the block could be erased and then rewritten in a manner not normally used during normal operation, such as by altering the word line voltage from the word line voltage normally used for write operations. Also, although the system and method is explained in the context of testing and refreshing rows of memory cells, it will be understood that the memory cells may be tested and/or refreshed in groups of other types. Finally, although the predicted malfunctions may be failures, they can also be limitations on the performance of the memory cells or memory device that do not amount to a failure. Other variations and alternatives will be apparent to one skilled in the art. Accordingly, the invention is not limited except as by the appended claims.

What is claimed is:

1. A system for predicting malfunctions in an array of memory cells, comprising:
 a storage device having sufficient capacity to store data stored in a row of the memory cells in the array;
 refresh circuitry operable to refresh rows of memory cells in the array, the refresh circuitry being operable to refresh a row of memory cells in the array under test with a test refresh rate and to refresh the remaining rows of memory cells in the array with a normal refresh rate that is substantially faster than the test refresh rate;
 data transfer circuitry coupled to the array of memory cells and the storage device, the data transfer circuitry being operable to copy the data stored in the row under test to the storage device before the refresh circuitry refreshes the row under test with the test refresh rate;
 data comparison circuitry coupled to the array of memory cells and the storage device, the data comparison circuitry being operable to compare at least some of the data stored in the storage device to at least some of the data stored in the row under test after the row under test has been refreshed with the test refresh rate, the data comparison circuitry being further operable to generate a malfunction indication if the data comparison circuitry determines that at least some of the data stored in the storage device does not match the data stored in the row under test after the row under test has been refreshed with the test refresh rate; and
 row repair logic coupled to the comparison circuitry, the row repair logic being operable responsive to the malfunction indication to remap accesses to the row under test to a redundant row of memory cells.

2. The system of claim 1 wherein the storage device comprises a row of memory cells in the array of memory cells.

3. The system of claim 1 wherein the refresh circuitry comprises:
 a refresh counter operable to generate a sequence of row addresses when the refresh counter is incremented;
 a test counter operable to output a test row address corresponding to a row of memory cells under test; and
 steering logic coupled to receive the row addresses from the refresh counter and the test row address from the test counter, the steering logic being operable to refresh the memory cells in the row corresponding to the row address received from the refresh counter if the address does not match the test row address and to refrain from refreshing the memory cells in the row corresponding to the row address received from the refresh counter if the address matches the test row address.

4. The system of claim 3, further comprising a refresh stress counter operable to increment responsive to the row address received from the refresh counter matching the test row address, the refresh stress counter being operable responsive to being incremented to a particular value to signal the end of the test of the row of memory cells under test.

5. The system of claim 1 wherein the data comparison circuitry comprises:
 a CRC generator operable to generate a pre-test CRC value corresponding to the data stored in the row of memory cells under test before the refresh circuitry refreshes the row under test with at the test refresh rate, and to generate a post-test CRC value corresponding to the data stored in the row of memory cells under test after the refresh circuitry has refreshed the row under test with the test refresh rate;
 a CRC storage device coupled to the CRC generator, the CRC storage device being operable to store the pre-test CRC value while the row of memory cells under test is being refreshed with the test refresh rate; and
 CRC comparison circuitry coupled to the CRC generator and the CRC storage device, the CRC comparison circuitry being operable to compare the pre-test CRC value stored in the CRC storage device to the post-test CRC value.

6. A system for managing memory device malfunctions, comprising:
 a storage device;
 test circuitry operable to sequentially test each of a plurality of groups of memory cells to detect a malfunction, the test circuitry testing the group of memory cells under test in a manner that may cause loss of the data stored in the group of memory cells under test, the test circuitry being operable to provide a pass indication if the group of memory cells under test has passed the test and to provide a malfunction indication if the group of memory cells under test has not passed the test;
 data transfer circuitry coupled to the groups of memory cells and the storage device, the data transfer circuitry being operable to copy the data stored in the group of memory cells under test to the storage device before testing of the group of memory cells; and
 corrective action circuitry coupled to the test circuitry and the data transfer circuitry, the corrective action circuitry being operable responsive to receiving a malfunction indication from the test circuitry to take corrective action, the correction circuitry comprising repair logic operable responsive to the malfunction indication to map accesses to the group of memory cells under test to a different group of memory cells.

7. The system of claim 6 wherein the data transfer circuitry is further operable responsive to the malfunction indication to copy the data stored in the storage device to the group of memory cells under test after testing of the group of memory cells under test has been completed.

8. The system of claim 6 wherein the memory cells comprise dynamic random access memory cells, and wherein the test circuitry is operable to test each of a plurality of groups of the memory cells by refreshing a row of memory cells under test with a refresh rate that is substantially slower than a normal refresh rate at which the remaining rows of memory cells are refreshed.

9. A method of predicting malfunctions in an array of dynamic random access memory cells, the method comprising:
   generating a sequence of row addresses to provide test row address corresponding to respective rows of memory cells that are to be refreshed at a test refresh rate;
   sequentially refreshing each of the rows of memory cells in the array corresponding to the respective row addresses in the generated sequence with the test refresh rate;
   refreshing the remaining rows of memory cells in the array with a normal refresh rate that is substantially faster than the test refresh rate;
   copying the data stored in each of the rows that are refreshed with the test refresh rate to a temporary storage device before the row is refreshed with the test refresh rate;
   comparing at least some of the data stored in the temporary storage device to at least some of the data stored in the row that is refreshed with the test refresh rate after the row has been refreshed with the test refresh rate;
   refreshing the memory cells in the row corresponding to the generated row address if the generated row address does not match the test row address; and
   refraining from refreshing the memory cells in the row corresponding to the generated row address if the generated address matches the test row address.

10. The method of claim 9, further comprising ending the refresh of the row of memory cells with the test refresh rate and then refreshing the row of memory cells with the normal refresh rate responsive to the generated row address matching the test row address a particular number of times.

11. The method of claim 9 wherein the act of comparing at least some of the data stored in the temporary storage device to at least some of the data stored in the row that is refreshed with the test refresh rate comprises:
   generating a pre-test CRC value corresponding to the data stored in the row of memory cells refreshed at the test refresh rate before the row is refreshed with the test refresh rate;
   generating a post-test CRC value corresponding to the data stored in the row of memory cells refreshed at the test refresh rate after the row has been refreshed with the test refresh rate;
   storing the pre-test CRC value while the row of memory cells refreshed at the test refresh rate is being refreshed with the test refresh rate; and
   comparing the pre-test CRC value to the post-test CRC value.

12. The method of claim 9, further comprising:
   generating a malfunction indication if at least some of the data stored in the temporary storage device does not match at least some of the data stored in the row that is refreshed with the test refresh rate after the row has been refreshed with the test refresh rate; and
   in response to the malfunction indication, remapping accesses to the row that was refreshed with the test refresh rate prior to the malfunction indication to a redundant row of memory cells.

13. A system for predicting malfunctions in an array of memory cells, comprising:
   a storage device having sufficient capacity to store data stored in a row of the memory cells in the array; and
   refresh circuitry operable to refresh rows of memory cells in the array, the refresh circuitry being operable to refresh a row of memory cells in the array under test with a test refresh rate and to refresh the remaining rows of memory cells in the array with a normal refresh rate that is substantially faster than the test refresh rate, the refresh circuitry comprising:
      a refresh counter operable to generate a sequence of row addresses when the refresh counter is incremented;
      a test counter operable to output a test row address corresponding to a row of memory cells under test;
      steering logic coupled to receive the row addresses from the refresh counter and the test row address from the test counter, the steering logic being operable to refresh the memory cells in the row corresponding to the row address received from the refresh counter if the address does not match the test row address and to refrain from refreshing the memory cells in the row corresponding to the row address received from the refresh counter if the address matches the test row address;
   data transfer circuitry coupled to the array of memory cells and the storage device, the data transfer circuitry being operable to copy the data stored in the row under test to the storage device before the refresh circuitry refreshes the row under test with the test refresh rate; and
   data comparison circuitry coupled to the array of memory cells and the storage device, the data comparison circuitry being operable to compare at least some of the data stored in the storage device to at least some of the data stored in the row under test after the row under test has been refreshed with the test refresh rate.

14. The system of claim 13, further comprising a refresh stress counter operable to increment responsive to the row address received from the refresh counter matching the test row address, the refresh stress counter being operable responsive to being incremented to a particular value to signal the end of the test of the row of memory cells under test.

15. A system for predicting malfunctions in an array of memory cells, comprising:
   a storage device having sufficient capacity to store data stored in a row of the memory cells in the array;
   refresh circuitry operable to refresh rows of memory cells in the array, the refresh circuitry being operable to refresh a row of memory cells in the array under test with a test refresh rate and to refresh the remaining rows of memory cells in the array with a normal refresh rate that is substantially faster than the test refresh rate;
   data transfer circuitry coupled to the array of memory cells and the storage device, the data transfer circuitry being operable to copy the data stored in the row under test to the storage device before the refresh circuitry refreshes the row under test with the test refresh rate; and
   data comparison circuitry coupled to the array of memory cells and the storage device, the data comparison circuitry being operable to compare at least some of the data stored in the storage device to at least some of the data stored in the row under test after the row under test has been refreshed with the test refresh rate, the data comparison circuitry comprising:
- a CRC generator operable to generate a pre-test CRC value corresponding to the data stored in the row of memory cells under test before the refresh circuitry refreshes the row under test with at the test refresh rate, and to generate a post-test CRC value corresponding to the data stored in the row of memory cells under test after the refresh circuitry has refreshed the row under test with the test refresh rate;
- a CRC storage device coupled to the CRC generator, the CRC storage device being operable to store the pre-test CRC value while the row of memory cells under test is being refreshed with the test refresh rate; and
- CRC comparison circuitry coupled to the CRC generator and the CRC storage device, the CRC comparison circuitry being operable to compare the pre-test CRC value stored in the CRC storage device to the post-test CRC value.

16. The system of claim 15, further comprising a refresh stress counter operable to increment responsive to the row address received from the refresh counter matching the test row address, the refresh stress counter being operable responsive to being incremented to a particular value to signal the end of the test of the row of memory cells under test.

17. A method of predicting malfunctions in an array of dynamic random access memory cells, the method comprising:
- sequentially refreshing each of the rows of memory cells in the array with a test refresh rate;
- refreshing the remaining rows of memory cells in the array with a normal refresh rate that is substantially faster than the test refresh rate;
- copying the data stored in the row that is refreshed with the test refresh rate to a temporary storage device before the row is refreshed with the test refresh rate; and
- comparing at least some of the data stored in the temporary storage device to at least some of the data stored in the row that is refreshed with the test refresh rate after the row has been refreshed with the test refresh rate by:
  - generating a pre-test CRC value corresponding to the data stored in the row of memory cells refreshed at the test refresh rate before the row is refreshed with the test refresh rate;
  - generating a post-test CRC value corresponding to the data stored in the row of memory cells refreshed at the test refresh rate after the row has been refreshed with the test refresh rate;
  - storing the pre-test CRC value while the row of memory cells refreshed at the test refresh rate is being refreshed with the test refresh rate; and
  - comparing the pre-test CRC value to the post-test CRC value.

18. The method of claim 17, further comprising:
- generating a malfunction indication if at least some of the data stored in the temporary storage device does not match at least some of the data stored in the row that is refreshed with the test refresh rate after the row has been refreshed with the test refresh rate; and
- in response to the malfunction indication, remapping accesses to the row that was refreshed with the test refresh rate prior to the malfunction indication to a redundant row of memory cells.

19. A method of predicting malfunctions in an array of dynamic random access memory cells, the method comprising:
- sequentially refreshing each of the rows of memory cells in the array with a test refresh rate;
- refreshing the remaining rows of memory cells in the array with a normal refresh rate that is substantially faster than the test refresh rate;
- copying the data stored in the row that is refreshed with the test refresh rate to a temporary storage device before the row is refreshed with the test refresh rate;
- comparing at least some of the data stored in the temporary storage device to at least some of the data stored in the row that is refreshed with the test refresh rate after the row has been refreshed with the test refresh rate;
- generating a malfunction indication if at least some of the data stored in the temporary storage device does not match at least some of the data stored in the row that is refreshed with the test refresh rate after the row has been refreshed with the test refresh rate; and
- in response to the malfunction indication, remapping accesses to the row that was refreshed with the test refresh rate prior to the malfunction indication to a redundant row of memory cells.

* * * * *